United States Patent [19]

Iga et al.

[11] Patent Number: 5,459,755
[45] Date of Patent: Oct. 17, 1995

[54] PLL CIRCUIT

[75] Inventors: Tetsuya Iga; Naoyuki Kato, both of Itami, Japan

[73] Assignee: Mitsubishi Denki Kabushiki Kaisha, Tokyo, Japan

[21] Appl. No.: 248,181

[22] Filed: May 24, 1994

[30] Foreign Application Priority Data

May 26, 1993 [JP] Japan ..................................... 5-124094

[51] Int. Cl.$^6$ .................................................. H03D 3/24
[52] U.S. Cl. ........................................... 375/376; 375/374
[58] Field of Search ..................................... 375/118, 119, 375/120, 374; 331/1 A, 14, 17, 25

[56] References Cited

U.S. PATENT DOCUMENTS

| 4,814,726 | 3/1989 | Byrd et al. ............................... 331/1 A |
| 5,144,156 | 9/1992 | Kawasaki ................................. 307/262 |

OTHER PUBLICATIONS

Iga et al. U.S. application Ser. No. 08/079,758 Jun. 22, 1993.

*Primary Examiner*—Stephen Chin
*Assistant Examiner*—Huong Luu

*Attorney, Agent, or Firm*—Oblon, Spivak, McClelland, Maier & Neustadt

[57] ABSTRACT

There is disclosed a PLL circuit wherein a delay circuit (3') of a phase comparator (30') receives a supply current (IC) from a first variable current source (ΦIC) and changes a delay time (ΔT) in negative correlation with the amount of the supply current (IC), and the first variable current source (ΦIC) changes the amount of the supply current (IC) to the delay circuit (3') in accordance with the indication of a control signal (C1) serving as a supply current control signal for a second variable current source (ΦIA) and a third variable current source (ΦIB) of a charge pump circuit (31). Changes in delay time of the delay device of the phase comparing device are adapted such that the delay time is constantly suitable as the amount of current of the phase comparison voltage signal of the charge pump circuit changes, permitting reduction in lock-up time.

15 Claims, 8 Drawing Sheets

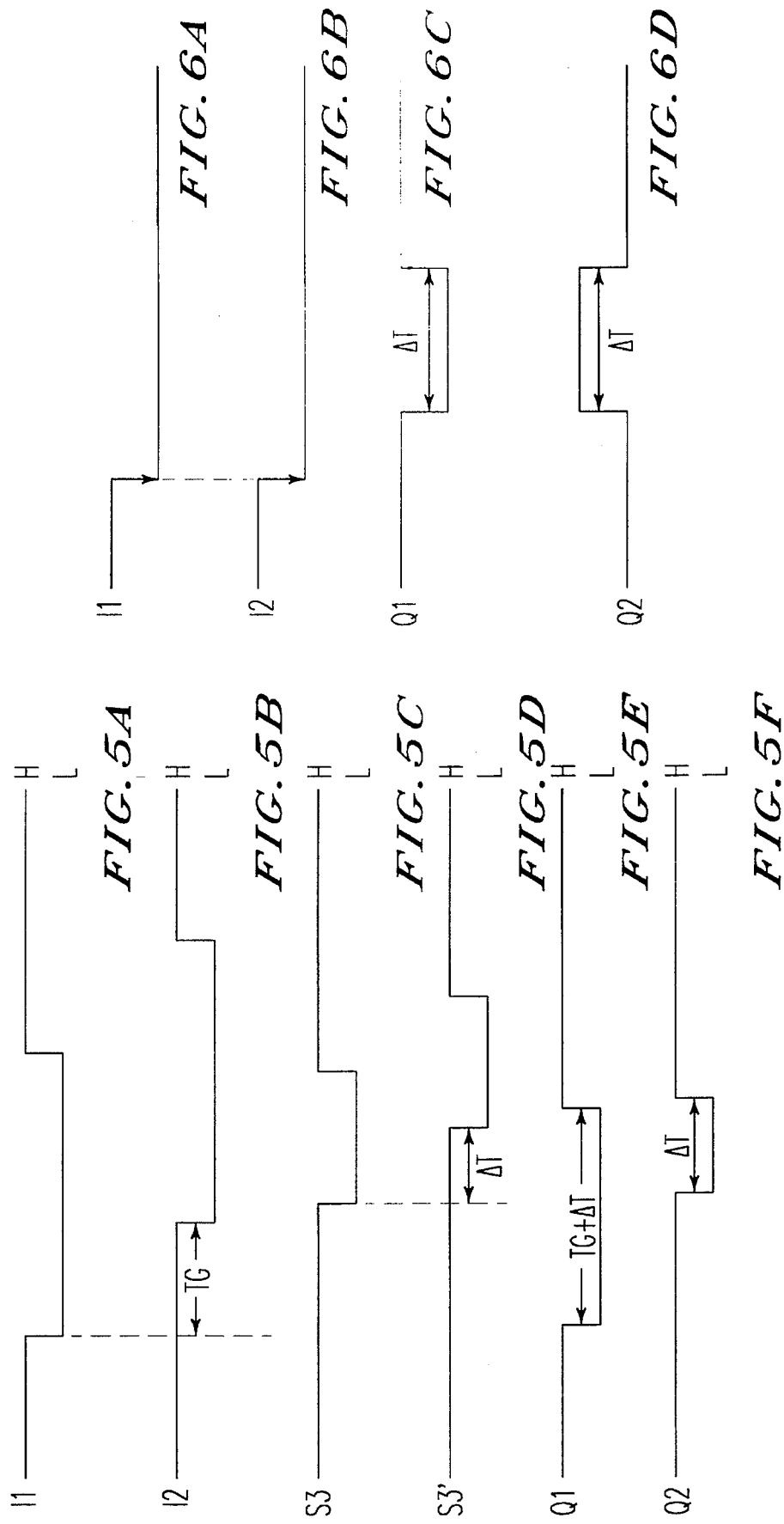

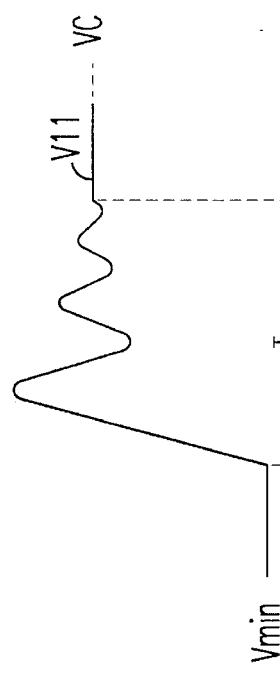
FIG. 10A
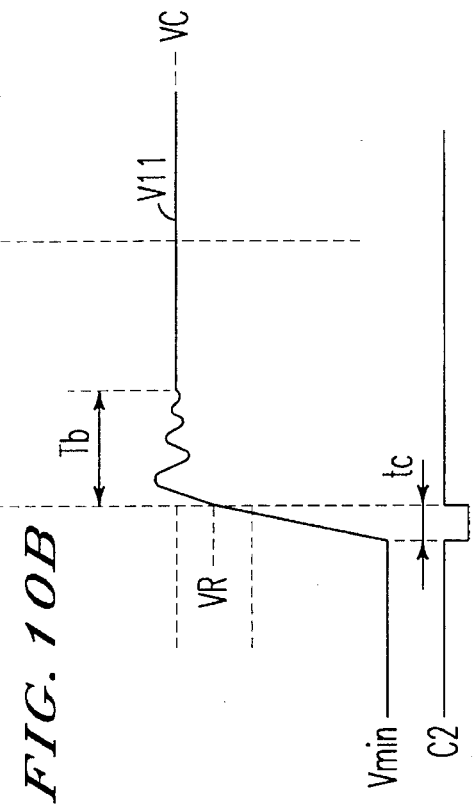
FIG. 10B
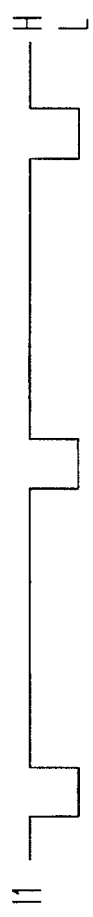
FIG. 9A  I1
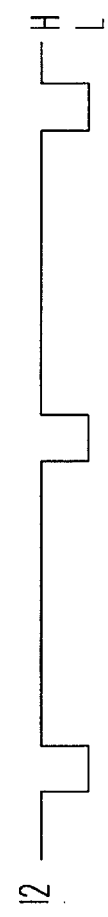
FIG. 9B  I2
FIG. 9C  C2
FIG. 9D  S15
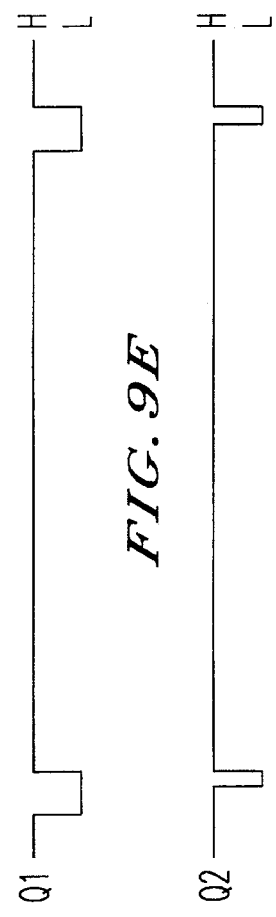
FIG. 9E  Q1
FIG. 9F  Q2

5,459,755

PLL CIRCUIT

BACKGROUND OF THE INVENTION

1. Field of the Invention

The present invention relates to a PLL (Phase-Locked Loop) circuit and, more particularly, to reduction in lock-up time.

2. Description of the Background Art

FIG. 12 is a circuit diagram of a conventional PLL circuit. The PLL circuit comprises a phase comparator 30, a charge pump circuit 31, an LPF 1, a VCO (voltage-controlled oscillator) 2, and a frequency divider 4, as shown in FIG. 12.

The phase comparator 30 includes nine NAND gates T1 to T9. The NAND gates T1 and T2 are three-input NAND gates, and the NAND gate T3 is a four-input NAND gate, the NAND gates T4 to T9 being two-input NAND gates.

Referring to FIG. 12, reference character I1 designates an input signal, and I2 designates a reference signal. The input signal I1 is accepted by a first input of the NAND gate T4. The output of the NAND gate T4 is applied to a first input of the NAND gate T1, a first input of the NAND gate T3, and a first input of the NAND gate T5. The output of the NAND gate T5 is applied to a second input of the NAND gate T1, a second input of the NAND gate T3, and a first input of the NAND gate T6. The output of the NAND gate T6 is fed back to a second input of the NAND gate T5.

The reference signal I2 is accepted by a first input of the NAND gate T9. The output of the NAND gate T9 is applied to a first input of the NAND gate T2, a third input of the NAND gate T3, and a first input of the NAND gate T8. The output of the NAND gate T8 is applied to a second input of the NAND gate T2, a fourth input of the NAND gate T3, and a first input of the NAND gate T7. The output of the NAND gate T7 is fed back to a second input of the NAND gate T8.

An output signal S3 from the NAND gate T3 is applied to the input of a delay circuit 3 which, in turn, adds a predetermined time delay to the signal S3 and then outputs a delay signal S3' to a third input of the NAND gate T1, a third input of the NAND gate T2, a second input of the NAND gate T6, and a second input of the NAND gate T7 through a node N1.

There are provided signals Q1 and Q2 outputted respectively from the NAND gates T1 and T2 in the form of phase comparison output signals.

The NAND gates T1 to T9 are connected in the foregoing manner. The NAND gates T1 and T4 form a first flip-flop, and the NAND gates T5 and T6 form a second flip-flop. The NAND gates T2 and T9 form a third flip-flop, and the NAND gates T7 ad T8 form a fourth flip-flop.

When the phase of the input signal I1 lags that of the reference signal I2, the phase comparator 30 as above constructed outputs the phase comparison output signal Q2 at L level of a pulse width proportional to the phase lag. Conversely, when the phase of the input signal I1 leads that of the reference signal I2, the phase comparator 30 outputs the phase comparison output signal Q1 at L level of a pulse width proportional to the phase lead.

FIG. 13 is a waveform chart showing the phase comparison of the phase comparator 30 of FIG. 12. When the phase of the input signal I1 leads that of the reference signal I2 by a time TG as shown in FIG. 13, an L-level pulse of the phase comparison output signal Q1 has a width (TG+$\Delta$T) and an L-level pulse of the phase comparison output signal Q2 has a width $\Delta$T.

The pulse width $\Delta$T is a delay time by the delay circuit 3. The L-level pulses of the phase comparison output signals Q1 and Q2 of the phase comparator 30 are adapted to additionally contain the pulse width $\Delta$T in this manner for the purpose of placing into responsive normal operation the charge pump circuit 31 receiving the phase comparison output signals Q1 and Q2. The pulse width $\Delta$T, if small, increases the likelihood that the charge pump circuit 31 enters the dead zone.

The charge pump circuit 31 which follows the phase comparator 30 includes a PMOS transistor T11, an NMOS transistor T12, a variable current source $\Phi$IA, and a variable current source $\Phi$IB. The PMOS transistor T11 and NMOS transistor T12 are connected in series. The variable current source $\Phi$IA is connected between the source of the PMOS transistor T11 and a power supply $V_{cc}$, and the variable current source $\Phi$IB is connected between the source of the NMOS transistor T12 and the ground. A signal given from a node N31 between the drain of the PMOS transistor T11 and the drain of the NMOS transistor T12 is a comparison voltage signal S31 of the charge pump circuit 31.

The phase comparison output signal Q1 from the phase comparator 30 is applied to the gate of the PMOS transistor T11. The phase comparison output signal Q2 is applied to an inverter T10 which in turn outputs the inverted phase comparison output signal $\overline{Q2}$ to the gate of the NMOS transistor T12.

The variable current source $\Phi$IA varies a supply current IA of the PMOS transistor T11 in response to a control signal C1, and the variable current source $\Phi$IB controls a supply current (sink current) IB of the NMOS transistor T12 in response to the control signal C1. The control signal C1 is an external signal given from a microcomputer, a lock detector or the like and indicates a relatively large current supply when lock starts, while indicating a relatively small current supply after lock is completed.

One of the PMOS and NMOS transistors T11 and T12 is on for a time period corresponding to the phase difference between the input signal I1 and the reference signal I2 in response to the phase comparison output signal Q1 and the inverted phase comparison output signal $\overline{Q2}$ whereby the charge pump circuit 31 outputs the comparison voltage signal S31 whose voltage value indicates the logical level "H" or "L".

The LPF 1 filters the comparison voltage signal S31 from the charge pump circuit 31 to apply a control voltage V1 to the VCO 2 which in turn oscillates at an oscillation frequency based on the control voltage V1 to output an output signal S2 to the frequency divider 4.

The frequency divider 4 applies the signal given by frequency-dividing the output signal S2 from the VCO 2 to the first input of the NAND gate T4 in the form of the input signal I1. In this way, the PLL circuit is formed which comprises the phase comparator 30, the charge pump circuit 31, the LPF 1, the VCO 2 and the frequency divider 4.

As a microcomputer or the like detects the lock start time from turn-on time of the power supply, the PLL circuit applies the control signal C1 indicative of large current supply to the variable current sources $\Phi$IA and $\Phi$IB of the charge pump circuit 31. As a result, the charge pump circuit 31 performs a large current supply operation for providing relatively large amounts of the supply currents IA and IB, thereby to increase the loop gain of the PLL circuit. Then the PLL circuit becomes locked at high speeds.

Then the microcomputer applies the control signal C1 indicative of small current supply to the variable current sources ΦIA and ΦIB of the charge pump circuit 31 after a given time has elapsed since the lock start time. When lock is completed, the charge pump circuit 31 performs a small current supply operation for providing relatively small amounts of the supply currents IA and IB, whereby the PLL circuit has a good C/N (carrier-to-noise ratio).

The provision of the delay circuit 3 in the phase comparator 30 prevents the pulse width of the phase comparison output signals Q1 and Q2Q2) from entering the dead zone which is a time period for which the charge pump circuit 31 cannot normally generate the comparison voltage signal S31, if the phase of the input signal I1 approaches that of the reference signal I2.

The length (of the duration) of the dead zone of the charge pump circuit 31 is negatively correlated with the supply current amounts IA and IB of the variable current sources ΦIA and ΦIB. The dead zone is short when the supply current amount is large, and the dead zone is long when the supply current amount is small. The delay circuit 3 has a given delay time.

When the charge pump circuit 31 has a small amount of supply current, too short delay time results in the dead zone problem. Conversely, when the charge pump circuit 31 has a large amount of supply current, too long delay time results in poor C/N of the PLL circuit.

This causes restriction of circuit design such as restriction of the supply current amount of the charge pump circuit 31. The PLL circuit has not been achieved which has a reduced lock-up time and a good C/N.

SUMMARY OF THE INVENTION

According to the present invention, a PLL circuit comprises: phase comparing means having delay means and receiving an input signal and a reference signal for outputting a phase comparison output signal having a pulse width, the pulse width being equal to a phase difference between the input signal and the reference signal plus a delay time of the delay means; charge pump means receiving the phase comparison output signal and an externally applied current control signal for outputting a phase comparison voltage signal based on the phase comparison output signal in an amount indicated by the current control signal; filtering means for filtering the phase comparison voltage signal to output a control voltage signal; and voltage-controlled oscillating means receiving the control voltage signal for outputting the input signal, the input signal oscillating at a frequency based on the control voltage signal, the phase comparing means, the charge pump means, the filtering means, and the voltage-controlled oscillating means forming a phase-locked loop (PLL) for performing a PLL operation, the delay means of the phase comparing means receiving the current control signal and being responsive to the current control signal for changing the delay time in negative correlation with the amount of current indicated by the current control signal.

Preferably, the phase comparing means is active for a predetermined time period immediately after start of the PLL operation, and the filtering means includes: a filter portion for filtering the phase comparison voltage signal to output the control voltage signal; and a voltage setting portion for setting the control voltage signal to a level indicative of the oscillation of the voltage-controlled oscillating means at an oscillation frequency in practical operation for the predetermined time period immediately after start of the PLL operation.

The delay means of the phase comparing means of the PLL circuit according to the present invention receives the current control signal and is responsive to the current control signal for changing the delay time in negative correlation with the amount of current indicated by the current control signal for controlling the amount of current of the voltage signal of the charge pump means. When the charge pump means has a relatively large amount of current of the phase comparison voltage signal and a short dead zone, the delay time is relatively short. When the charge pump means has a relatively small amount of current of the voltage signal and a long dead zone, the delay time is relatively long.

As a result, the delay time of the delay means of the phase comparing means may be set so as to be longer than the dead zone of the charge pump means in a range which does not impair the C/N of the PLL circuit itself independently of the amount of current of the phase comparison voltage signal outputted from the charge pump means, permitting high-speed lock and a good C/N.

Further, the phase comparing means of the PLL circuit is inactive only for the predetermined time period immediately after start of the PLL operation. The filtering means includes the voltage setting means which sets the control voltage signal to the practical operation level indicating the oscillation of the voltage-controlled oscillating means at the oscillation frequency in practical operation.

As a result, the phase comparing means becomes inactive after the control voltage of the voltage-controlled oscillating means is set to the practical operation level for a short time. Then the practical PLL operation is performed based on the phase comparison between the input signal and the reference signal, permitting higher-speed lock.

An object of the present invention is to provide a PLL circuit which has a reduced lock-up time and a good C/N.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5 and 6 are timing charts of the operation of the PLL circuit of the first preferred embodiment;

FIGS. 9, 10A and 10B are timing charts of the operation of the PLL circuit of the second preferred embodiment;

DESCRIPTION OF THE PREFERRED EMBODIMENTS

First Preferred Embodiment

Figure 1:
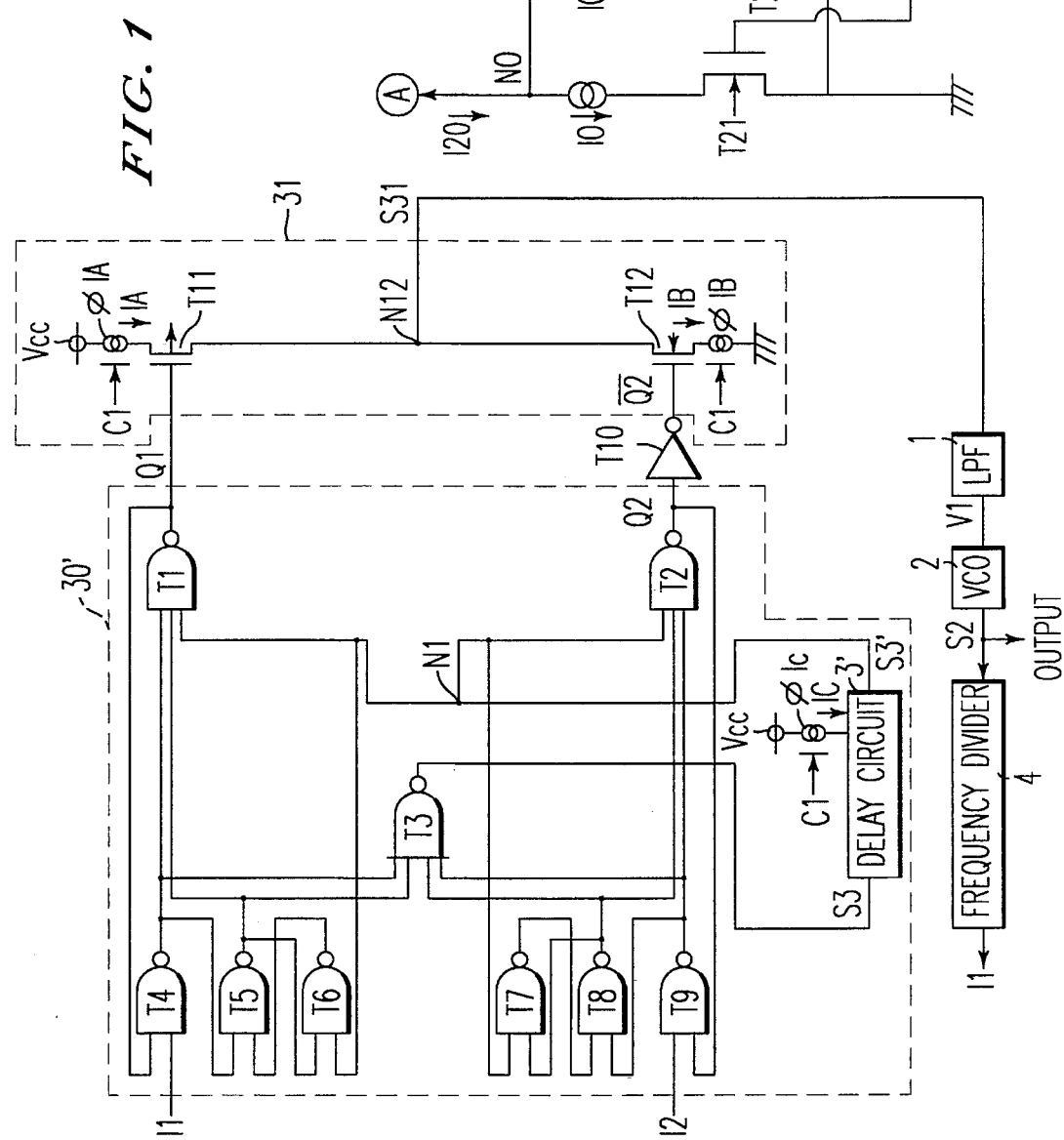
FIG. 1 is a circuit diagram of a PLL circuit according to a first preferred embodiment of the present invention.

FIG. 1 is a circuit diagram of a PLL circuit according to a first preferred embodiment of the present invention. The PLL circuit of the first preferred embodiment comprises a phase comparator 30', a charge pump circuit 31, an LPF 1, a VCO 2, and a frequency divider 4, as shown in FIG. 1.

The phase comparator 30' is comprised of nine NAND gates T1 to T9. The NAND gates T1 and T2 are three-input NAND gates, the NAND gate T3 is a four-input NAND gate, and the NAND gates T4 to T9 are two-input NAND gates.

Referring to FIG. 1, reference character I1 designates an input signal, and I2 designates a reference signal. The input signal I1 is accepted by a first input of the NAND gate T4. The output of the NAND gate T4 is applied to a first input of the NAND gate T1, a first input of the NAND gate T3, and a first input of the NAND gate T5. The output of the NAND gate T5 is applied to a second input of the NAND gate T1, a second input of the NAND gate T3, and a first input of the NAND gate T6. The output of the NAND gate T6 is fed back to a second input of the NAND gate T5.

The reference signal I2 is accepted by a first input of the NAND gate T9. The output of the NAND gate T9 is applied to a first input of the NAND gate T2, a third input of the NAND gate T3, and a first input of the NAND gate T8. The output of the NAND gate T8 is applied to a second input of the NAND gate T2, a fourth input of the NAND gate T3, and a first input of the NAND gate T7. The output of the NAND gate T7 is fed back to a second input of the NAND gate T8.

An output signal S3 from the NAND gate T3 is applied to the input of a delay circuit 3' which, in turn, applies a time delay $\Delta T$ to the signal S3 and then outputs a delay signal S3' to a third input of the NAND gate T1, a third input of the NAND gate T2, a second input of the NAND gate T6, and a second input of the NAND gate T7 through a node N1.

There are provided signals Q1 and Q2 outputted respectively from the NAND gates T1 and T2 in the form of phase comparison output signals.

The NAND gates TI to T9 are connected in the foregoing manner. The NAND gates T1 and T4 form a first flip-flop, and the NAND gates T5 and T6 form a second flip-flop. The NAND gates T2 and T9 form a third flip-flop, and the NAND gates T7 and T8 form a fourth flip-flop.

A variable current source $\Phi IC$ is connected between a power supply $V_{cc}$ and the delay circuit 3' and supplies a supply current IC to the delay circuit 3' in which the delay time $\Delta T$ varies in negative correlation with the amount of supply current IC. It should be noted that the variable current source $\Phi IC$ varies the amount of supply current IC to the delay circuit 3' in accordance with the indication of a control signal C1 which controls the supply currents of variable current sources $\Phi IA$ and $\Phi IB$ of the charge pump circuit 31.

The control signal C1 is an external signal given from a microcomputer, a lock detector or the like. The control signal C1 gives a large current supply indication, i.e., indicates a relatively large amount of the supply currents IA, IB, IC when lock starts, and gives a small current supply indication, i.e., indicates a relatively small amount of the supply currents IA, IB, IC after lock is completed.

When the phase of the input signal I1 lags that of the reference signal I2, the phase comparator 30' outputs the phase comparison output signal Q2 at L level of a pulse width which is equal to the phase lag plus the delay time $\Delta T$. Conversely, when the phase of the input signal I1 leads that of the reference signal I2, the phase comparator 30' outputs the phase comparison output signal Q1 at L level of a pulse width which is equal to the phase lead plus the delay time $\Delta T$.

For example, when the phase of the input signal I1 leads that of the reference signal I2 by a time TG as shown in FIG. 5, an L-level pulse of the phase comparison output signal Q1 has a width (TG+$\Delta T$) and an L-level pulse of the phase comparison output signal Q2 has a width $\Delta T$. When the input signal I1 is in phase with the reference signal I2 as shown in FIG. 6, an L-level pulse of the phase comparison output signals Q1 and Q2 has a width $\Delta T$.

The charge pump circuit 31 which follows the phase comparator 30' includes a PMOS transistor T11, an NMOS transistor T12, the variable current source $\Phi IA$, and the variable current source $\Phi IB$. The PMOS transistor T11 and the NMOS transistor T12 are connected in series. The variable current source $\Phi IA$ is connected between the source of the PMOS transistor T11 and the power supply $V_{cc}$, and the variable current source $\Phi IB$ is connected between the source of the NMOS transistor T12 and the ground. A signal given from a node N31 between the drain of the PMOS transistor T11 and the drain of the NMOS transistor T12 is a comparison voltage signal S31 of the charge pump circuit 31.

The phase comparison output signal Q1 of the phase comparator 30' is applied to the gate of the PMOS transistor T11. The phase comparison output signal Q2 is inverted by an inverter T10 which in turn applies the inverted phase comparison output signal $\overline{Q2}$ to the gate of the NMOS transistor T12.

Figure 2:
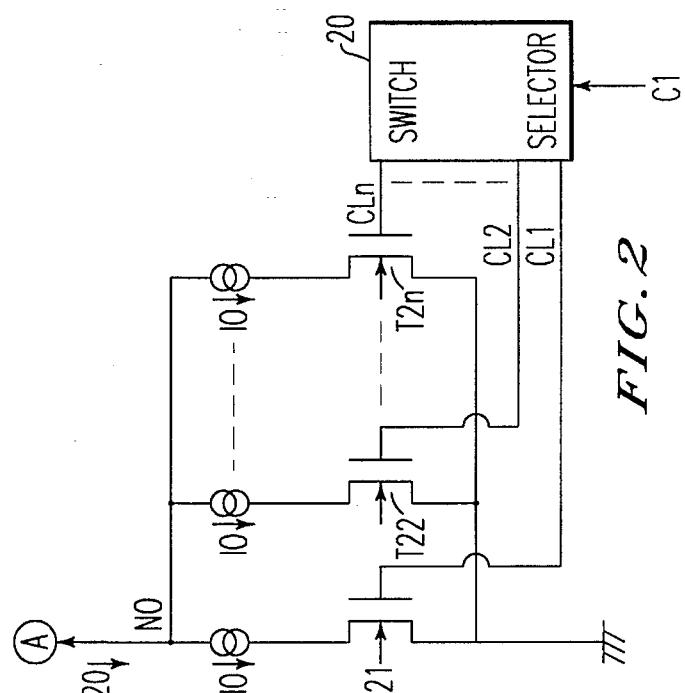
FIG. 2 is a circuit diagram of a control current generator for variable current sources shown in FIG. 1.
Figure 4:
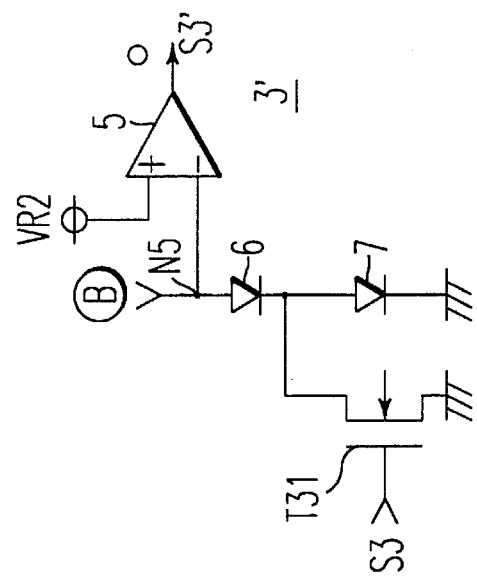
FIG. 4 is a circuit diagram showing the internal construction of a delay circuit shown in FIG. 1.
Figure 3:
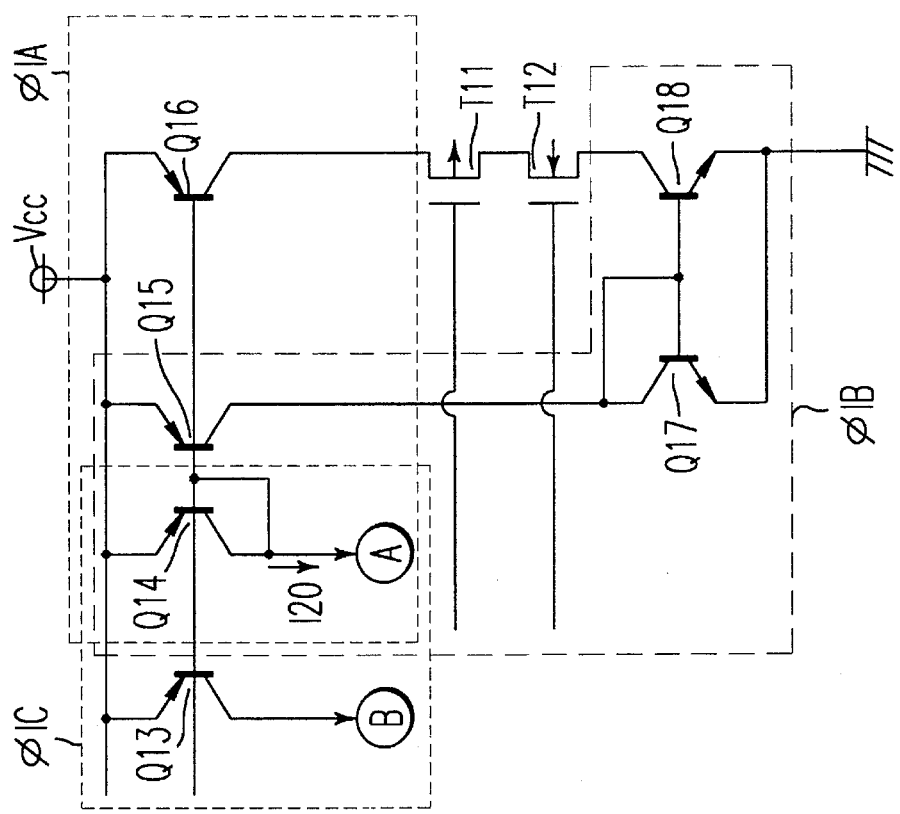
FIG. 3 is a circuit diagram of a supply current generator for the variable current sources shown in FIG. 1.

FIG. 2 is a circuit diagram of a control current generator for the variable current sources $\Phi IA$, $\Phi IB$ and $\Phi IC$. FIG. 3 is a circuit diagram of a supply current generator for the variable current sources $\Phi IA$, $\Phi IB$ and $\Phi IC$. FIG. 4 is a circuit diagram showing the internal construction of the delay circuit 3' of the phase comparator 30'.

Referring to FIG. 2, a switch selector 20 receives the control signal C1 and then applies control signals CL1, CL2, . . . , CLn determined based on the control signal C1 to the gates of NMOS transistors T21, T22, . . . , T2n, respectively. Each drain of the NMOS transistors T21, T22, . . . , T2n is connected to a constant current source I0, and the sources thereof are grounded in common.

The n constant current sources I0 are connected in common at a node N0, which is connected to the collector and base of a transistor Q14, as shown in FIGS. 2 and 3. Thus the node NO carries a control current I20 which increases in proportion to the number of transistors T21 to T2n which are on.

Referring to FIG. 3, the variable current source $\Phi IA$ is comprised of PNP bipolar transistors Q14 and Q16 whose emitters are connected to the power supply $V_{cc}$ in common. The transistor Q16 is current-mirror connected to the transistor Q14, and the collector of the transistor Q16 is connected to the source of the PMOS transistor T11. Thus the amount of the supply current IA of the variable current source $\Phi IA$ is equal to the amount of the control current I20 flowing in the collector of the transistor Q14.

The variable current source $\Phi IB$ is comprised of PNP bipolar transistors Q14, Q15 whose emitters are connected to the power supply $V_{cc}$ in common and NPN transistors Q17, Q18. The transistor Q15 is current-mirror connected to the transistor Q14. The transistors Q17 and Q18 form a current mirror circuit. The base and collector of the transistor Q17 is connected to the collector of the transistor Q15. The collector of the transistor Q18 is connected to the source of the transistor T12. Thus, the amount of the supply current IB of the variable current source ΦIB, as well as the variable current source ΦIA, is equal to the amount of the control current I20.

The variable current source ΦIC is comprised of PNP bipolar transistors Q14 and Q13 whose emitters are connected to the power supply $V_{cc}$ in common. The bases of the transistors Q13 and Q14 are commonly connected. The transistor Q13 differs from the transistor Q14 in size.

The collector of the transistor Q13 is connected to a negative input of a comparator 5 of the delay circuit 3', as shown in FIGS. 3 and 4. A reference voltage VR2 is applied to a positive input of the comparator 5, and the negative input of the comparator 5 is connected to the anode of a diode 6. The cathode of the diode 6 is grounded through an NMOS transistor T31 and is also connected to the anode of a diode 7. The cathode of the diode 7 is grounded. The output signal S3 from the NAND gate T3 of the phase comparator 30' is applied to the gate of the NMOS transistor T31.

Respective drop voltages of the diodes 6 and 7 are VF6 and VF7, and the relation between the drop voltages VF6, VF7 and the reference voltage VR2 is as follows:

$$VF6 < VR2 < (VF6+VF7)$$

In the delay circuit 3' of FIG. 4, when the output signal S3 is "H", the transistor T31 is on and the potential at the negative input node N5 is VF6, then the output signal S3' from the comparator 5 being "H". Conversely, when the output signal S3 is "L", the transistor T31 is off and the potential at the negative input node N5 is (VF6+VF7), then the output signal S3' from the comparator 5 being "L".

The delay time ΔT of the delay circuit 3' is the sum of a potential change delay time ΔT1 required for potential change at the negative input node N5 of the comparator 5 resulting from on/off of the transistor T31 in accordance with the signal change of the output signal S3 and an operation delay time ΔT2 of the comparator 5.

The potential change delay time ΔT1 changes depending on the amount of the supply current IC to the negative input node N5. That is, the potential change delay time ΔT1 is long when the amount of the supply current IC is small, and is short when the amount is large.

Since the collector of the transistor Q13 is connected to the negative input of the comparator 5 of the delay circuit 3' as above described, the amount of the supply current IC of the variable current source ΦIC is proportional to the amount of the control current I20.

In the foregoing charge pump circuit 31, the switch selector 20 operates in response to the control signal C1. When the control signal C1 provides the large current supply indication, the switch selector 20 outputs the control signals CL1 to CLn which cause almost all of the transistors T21 to T2n to turn on. When the control signal C1 provides the small current supply indication, the switch selector 20 outputs the control signals CL1 to CLn which cause some of the transistors T21 to T2n to turn on. Consequently, the amount of the control current I20 is determined in response to the control signal C1.

The variable current source ΦIA supplies the supply current IA in the same amount as the control current I20 to the PMOS transistor T11. The supply current IB in the same amount as the control current I20 is sunk into the variable current source ΦIB from the NMOS transistor T1.

As a result, one of the PMOS and NMOS transistors T11 and T12 turns on in response to the phase comparison output signal Q1 and the inverted phase comparison output signal Q2 whereby the charge pump circuit 31 outputs the "H" or "L" comparison voltage signal S31.

A minimum response time $\Delta R_{min}$ of the gate input pulse of the PMOS and NMOS transistors T11 and T12 is negatively correlated with the supply current IA (IB). The minimum response time $\Delta R_{min}$ becomes shorter as the supply current IA increases, and becomes longer as the supply current IA decreases. The minimum response time $\Delta R_{min}$ is a minimum pulse time width for which the charge pump circuit 31 does not enter the dead zone.

The comparison voltage signal S31 of the charge pump circuit 31 is applied to the VCO 2 in the form of a control voltage V1 through the LPF 1. The VCO 2 oscillates at a frequency based on the control voltage V1 and applies an output signal S2 to the frequency divider 4.

The output signal S2 from the VCO 2 is frequency-divided by the frequency divider 4 which in turn applies the resultant signal to the first input of the NAND gate T4 in the form of the input signal I1. The PLL circuit is constructed as described hereinabove.

The supply current IC proportional to the control current I20 is supplied to the negative input node N5 of the delay circuit 3'. Thus the delay time ΔT (potential change delay time ΔT1) is relatively short when the variable current sources ΦIA and ΦIB supply large amounts of current, whereas the delay time ΔT is relatively long when they supply small amounts of current. Since the amount of the supply current IA is proportional to the amount of the control current I20, the delay time ΔT changes in negative correlation with the supply current IA.

In the PLL circuit of the first preferred embodiment, as a microcomputer or the like detects the lock start time from turn-on time of the power supply, the control signal C1 indicative of large current supply is applied to the variable current sources ΦIA and ΦIB of the charge pump circuit 31. Consequently, the charge pump circuit 31 performs a large current supply operation to increase the loop gain of the PLL circuit, whereby the PLL circuit becomes locked at high speeds.

When the charge pump circuit 31 supplies the large amount of current, the dead zone of the charge pump circuit 31 is short although the delay time ΔT of the delay circuit 3' is short. Thus the pulse width of the phase comparison output signals Q1 and Q2 of the phase comparator 30' does not enter the dead zone.

The microcomputer or the like applies the control signal C1 indicative of small current supply to the variable current sources ΦIA and ΦIB of the charge pump circuit 31 after a given time has elapsed since the lock start time. Consequently, the charge pump circuit 31 performs the small current supply operation when lock is completed, permitting the PLL circuit to have a good C/N.

When the charge pump circuit 31 supplies the small amount of current, the delay time ΔT of the delay circuit 3' is long although the dead zone of the charge pump circuit 31 is relatively long. Thus the pulse width of the phase comparison output signals Q1 and Q2 of the phase comparator 30' does not enter the dead zone of the charge pump circuit 31 if the phase difference is very small between the input signal I1 and the reference signal I2.

That is, the delay time ΔT is relatively short for the PLL operation as shown in FIG. 5 when the charge pump circuit 31 supplies the large amount of current, and the delay time ΔT is relatively long for the PLL operation as shown in FIG. 6 when the charge pump circuit 31 supplies the small amount of current.

If the input signal I1 and the reference signal I2 are in phase, for example, the output pulse width of the phase comparison output signals Q1 and Q2 is equal to only the delay time ΔT of the delay circuit 3'. This delay time ΔT is of a length equal to or more than the minimum response time $\Delta R_{min}$ for which the charge pump circuit 31 does not enter the dead zone.

Figure 7:
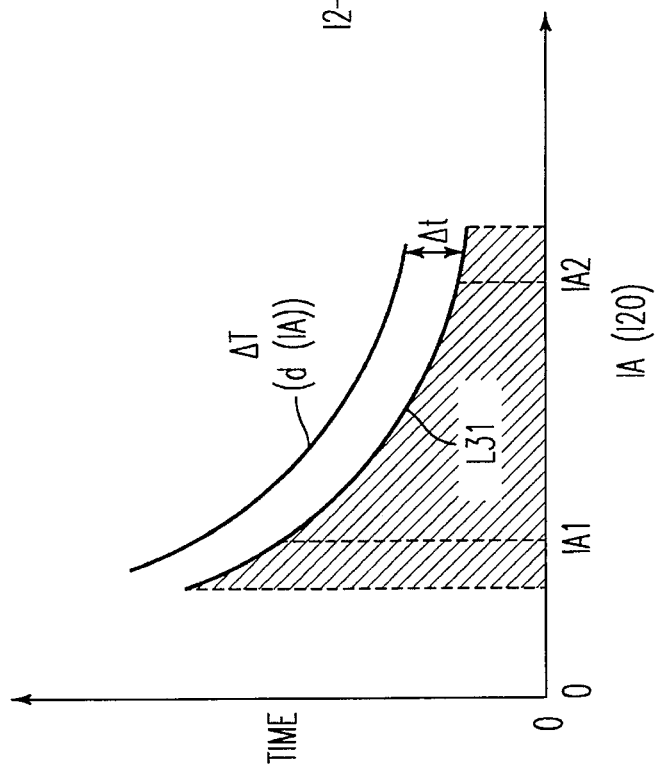
FIG. 7 is a graph showing a delay time of the delay circuit of FIG. 1 versus a dead zone region of a charge pump circuit.

FIG. 7 is a graph showing the dead zone region of the charge pump circuit 31 versus the delay time ΔT of the delay circuit 3'. A region lower than a dead zone curve L31 is the dead zone region (shaded with oblique lines). The dead zone changes in negative correlation with the supply current IA (control current I20), as shown in FIG. 7. Similarly, the delay time ΔT changes in negative correlation with the supply current IA (control current I20), with a +Δt margin over the dead zone curve L31.

The delay time ΔT of the delay circuit 3' is, therefore, not shorter than the dead zone of the charge pump circuit 31 independently of the changes of the supply currents IA and IB of the charge pump circuit 31. Further, since the delay time ΔT always changes with the +Δt margin over the dead zone curve L31, the delay time ΔT is not so long as to impair the C/N of the charge pump circuit 31.

Therefore, the PLL circuit of the first preferred embodiment is permitted to freely set the supply currents IA and IB of the charge pump circuit 31 without any hindrance and has a reduced lock-up time and a good C/N.

Second Preferred Embodiment

The PLL circuit of the first preferred embodiment when it is off (power off state, interruption of intermittent operation, or the like) is not enabled to continue applying the normal-level control voltage V1 to the VCO 2. This causes the oscillation frequency of the output signal S2 of the VCO 2 to be set to its maximum value or its minimum value.

Assuming that maximum and minimum oscillation frequencies of the VCO 2 when the PLL circuit is off are designated by $f_{max}$ and $f_{min}$ respectively, and maximum and minimum oscillation frequencies of the VCO 2 in practical use when the PLL circuit is on are designated by $f_{real \cdot max}$ and $f_{real \cdot min}$, respectively, then the following expressions (I) to (III) hold:

$$f_{real \cdot max} - f_{real \cdot min} = \Delta f_{real} \qquad (I)$$

$$f_{max} - f_{real \cdot max} > 22 \, \Delta f_{real} \qquad (II)$$

$$f_{real \cdot min} - f_{min} >> \Delta f_{real} \qquad (III)$$

It will be apparent from Expressions (I) to (III) that the maximum (minimum) oscillation frequency of the VCO 2 which is set when the PLL circuit is off is too far from a frequency region of the VCO 2 in practical use (practical use frequency region).

A need exists to change the control voltage V1 of the VCO 2 largely to return the oscillation frequency of the VCO 2 to the practical use frequency region when the PLL circuit is switched from off to on (application of power, start of intermittent operation, or the like). This increases an overshoot and, accordingly, it takes time for the control voltage V1 to settle on the normal-level control voltage V1, preventing the reduction of the lock-up time for the PLL circuit.

For solving the problem, there is provided a PLL circuit of a second preferred embodiment according to the present invention.

Figure 8:
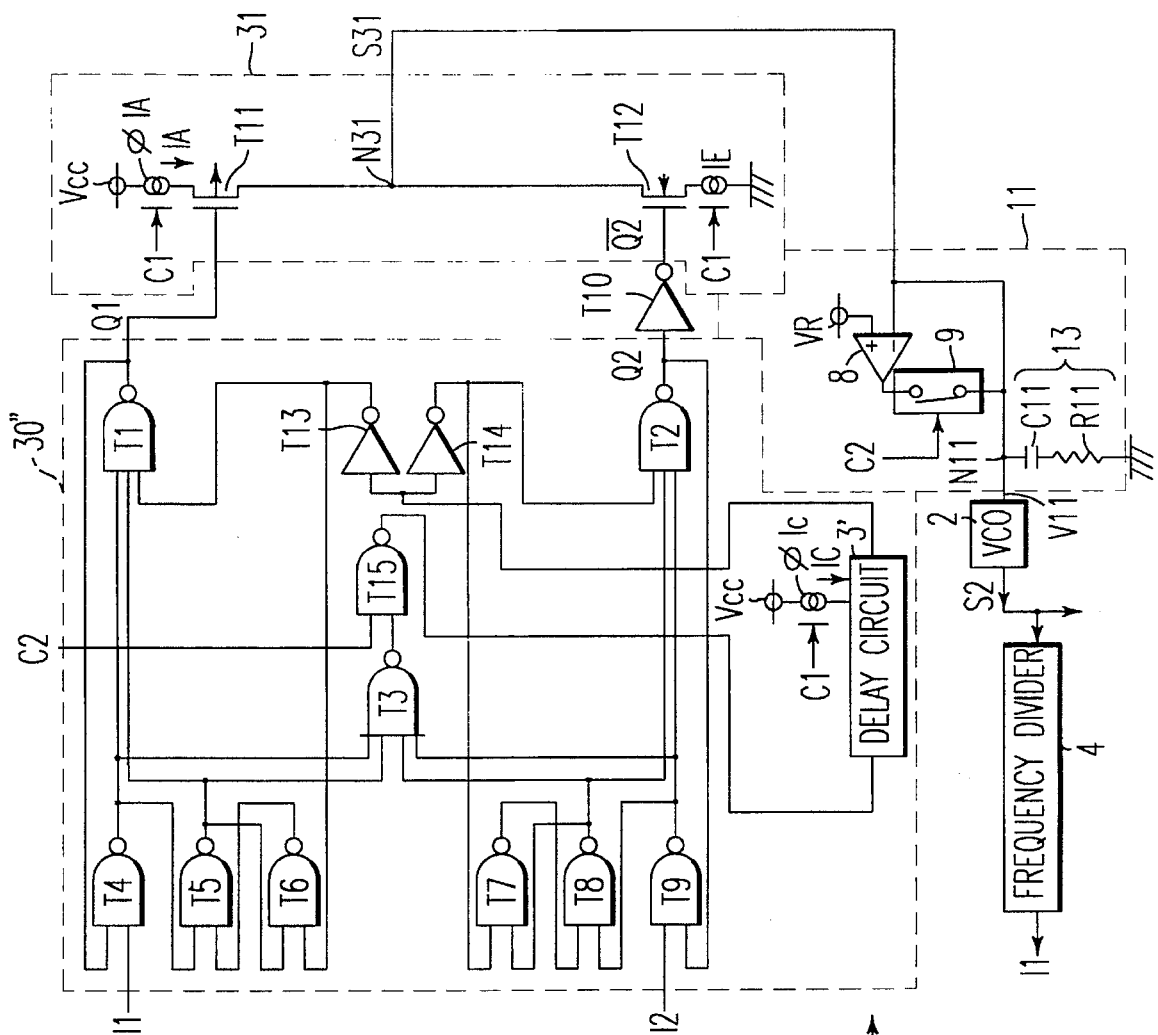
FIG. 8 is a circuit diagram of the PLL circuit according to a second preferred embodiment of the present invention.

FIG. 8 is a circuit diagram of the PLL circuit of the second preferred embodiment according to the present invention. The PLL circuit of the second preferred embodiment comprises a phase comparator 30", the charge pump circuit 31 a filter block 11, the VCO 2, and the frequency divider 4, as shown in FIG. 8. The phase comparator 30" and the filter block 11 which are the difference from the PLL circuit of the first preferred embodiment will be described hereinafter, and the description of the other components will be omitted herein.

The phase comparator 30" is comprised of ten NAND gates T1 to T9, T15, and two inverters T13, T14. The NAND gates T1 and T2 are three-input NAND gates. The NAND gate T3 is a four-input NAND gate. The NAND gates T4 to T9 and T15 are two-input NAND gates.

The phase comparator 30" is similar in construction to the phase comparator 30' of the first preferred embodiment except that the NAND gate T15 and the inverters T13, T14 are provided in the next position of the NAND gate T3. The NAND gate T15 has a first input accepting a control signal C2 and a second input accepting the output of the NAND gate T3. The output of the NAND gate T15 is applied to the inputs of the inverters T13 and T14. The output of the inverter T13 is applied to a third input of the NAND gate T1 and to a second input of the NAND gate T6. The output of the inverter T14 is applied to a third input of the NAND gate T2 and to a second input of the NAND gate T7.

The control signal C2 applied externally from a microcomputer or the like is "L" for only a relatively short period of time tc after the PLL circuit turns on and is "H" for the rest time periods. The other constructions of the phase comparator 30" are similar to those of the phase comparator 30' of the first preferred embodiment, and the description thereof will be omitted herein.

The phase comparator 30" as above constructed is inactive for a time period TL where the control signal C2 is "L" independently of the phase difference between the input signal I1 and the reference signal I2 because an output signal S15 from the NAND gate T15 is fixed to "L", and the phase comparison output signals Q1 and Q2 are fixed to "H", as shown in FIG. 9.

The filter block 11 is comprised of an operational amplifier 8, a switch 9, a capacitor C11 and a resistor R11. The filter block 11 receives the comparison voltage signal S31 from the charge pump circuit 31 and applies a control voltage V11 to the VCO 2.

The operational amplifier 8 receives a reference voltage VR at its positive input. The output of the operational amplifier 8 is fed back to its negative input through the switch 9 and is also applied to the VCO 2 through the switch 9 and a node N11. The switch 9 turns on/off in response to "L"/"H" of the control signal C2. The capacitor C11 and resistor R11 connected in series between the node N11 and the ground form a lag lead filter 13.

It should be noted that the reference voltage VR is set to a predetermined voltage level which permits the output signal S2 of the VCO 2 to oscillate in a frequency range in practical use.

When the switch 9 is on, the output of the operational amplifier 8 is electrically connected to the node N11, and the filter block 11 outputs the reference voltage VR. Then the reference voltage VR charges the lag lead filter 13.

When the switch 9 is off, the output of the operational amplifier 8 is electrically shut off from the node N11, and the filter block 1 is thus equivalent to a circuit including the lag lead filter 13 serving as the LPF between the charge pump circuit 31 and the VCO 2.

As the microcomputer or the like detects the lock start time from turn-on time of the power supply, the PLL circuit of the second preferred embodiment applies the control signal C1 indicative of large current supply to the variable current sources ΦIA and ΦIB of the charge pump circuit 31. As a result, the charge pump circuit 31 performs the large current supply operation.

When the charge pump circuit 31 supplies the large amount of current, the dead zone of the charge pump circuit 31 is short although the delay time ΔT of the delay circuit 3' is short. Thus the pulse width of the phase comparison output signals Q1 and Q2 of the phase comparator 30" does not enter the dead zone of the charge pump circuit 31.

During the short period of time tc immediately after the PLL circuit turns on, the control signal C2 is "L" and the phase comparison output signals Q1 and Q2 are fixed to "H", the phase comparator 30" being inactive. The PMOS transistor T11 and the NMOS transistor T12 of the charge pump circuit 31 are both off, and the comparison voltage signal S31 is floating. At this time, the switch 9 of the filter block 11 is on, and the reference voltage VR charges the node N11. The reference voltage VR is rapidly applied to the VCO 2 in the form of the control voltage V11.

In the case where the control voltage V11 when the PLL circuit is off is a minimum voltage $V_{min}$ corresponding to the minimum oscillation frequency $f_{min}$ as shown in FIGS. 10A and 10B, the control voltage V11 abruptly rises from the minimum voltage $V_{min}$ toward the reference voltage VR during the short period of time tc of FIG. 10B.

As the short period of time tc immediately after the PLL circuit turns on has elapsed, the control signal C2 returns to "H" and the phase comparator 30" becomes active. Then the comparison voltage signal S31 of the charge pump circuit 31 is "H" or "L" depending on the phase difference between the input signal I1 and the reference signal I2.

The switch 9 of the filter block 11 turns off, and the lag lead filter 13 filters the comparison voltage signal S31 to output the control voltage V11 to the VCO As shown in the timing chart of the potential change of the control voltage V11 of FIG. 10B, the control voltage V11 is forced to be set to the reference voltage VR during the short period of time tc immediately after the PLL circuit turns on. After the short period of time tc has elapsed, the practical PLL operation starts from the point where the control voltage V11 is equal to the reference voltage VR on the basis of the phase difference between the input signal I1 and the reference signal I2. The control voltage V11 finally reaches a lock level VC for a relatively short time period Ta with less overshoot.

As shown in the timing chart of the potential change of the control voltage V11 of FIG. 10A, the conventional PLL circuit (as well as the first preferred embodiment) has controlled the control voltage V11 so as to reach the lock level VC from the minimum voltage $V_{min}$ which is too far from the reference voltage VR only by the practical PLL operation. In this case, the control voltage V11 reaches the lock level VC for a relatively long period of time Ta because of its large overshoot.

The voltage change required for the control voltage V11 to reach the lock level VC is (VC–$V_{min}$) in the conventional PLL circuit. In the PLL circuit of the second preferred embodiment, however, the required voltage change is (VC–VR) since the control voltage V11 precharges up to the reference voltage VR during the short period of time tc immediately after the operation start. This greatly reduces the time required for the control voltage V11 to settle on the lock level VC, providing higher-speed lock. The higher-speed lock is similarly enabled if the control voltage V11 when the PLL circuit is off is a maximum voltage $V_{max}$ corresponding to the maximum oscillation frequency $f_{max}$.

The succeeding operation and effects of the second preferred embodiment are similar to those of the first preferred embodiment, and the description thereof will be omitted herein.

Third Preferred Embodiment

Figure 11:
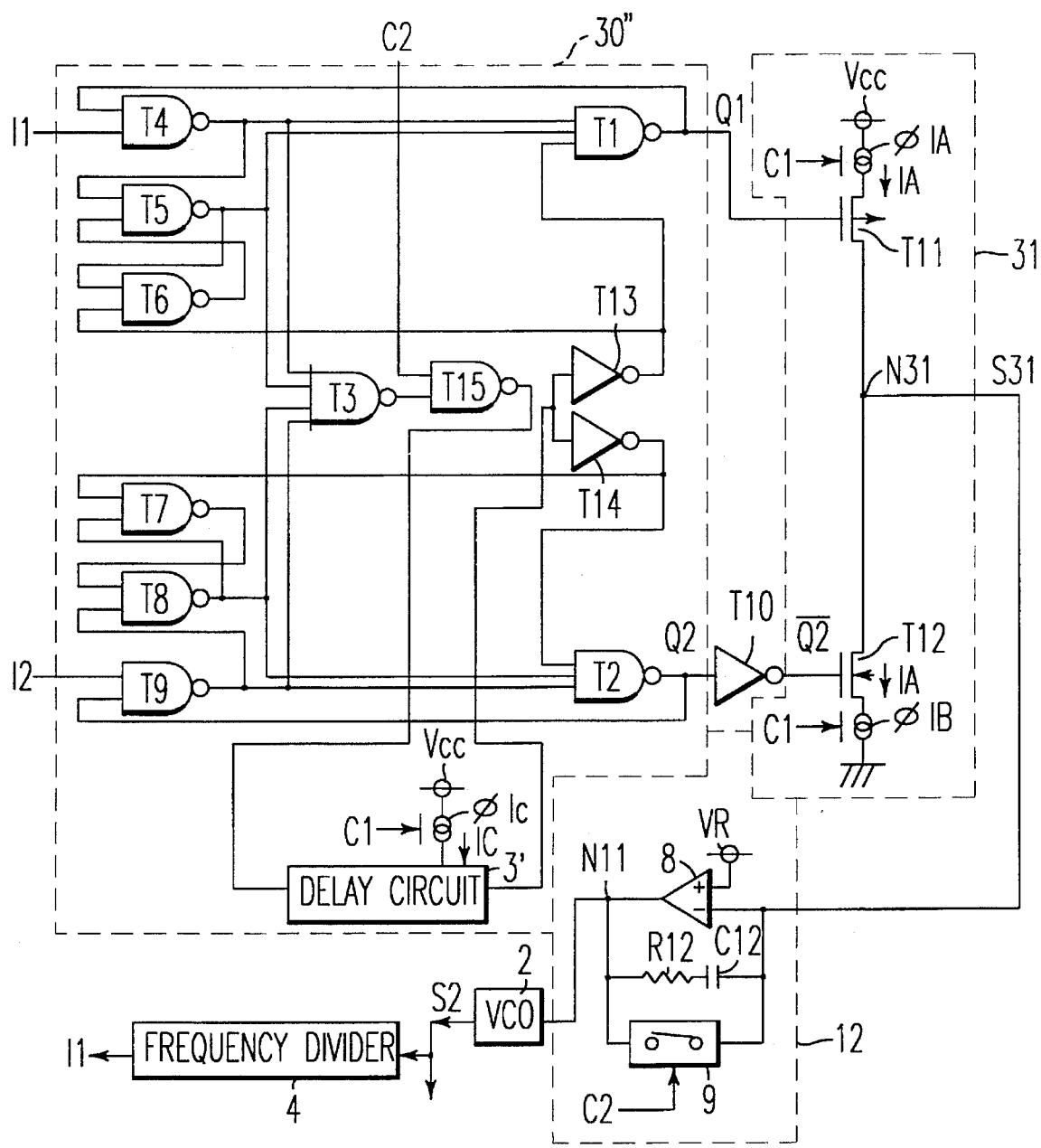
FIG. 11 is a circuit diagram of the PLL circuit according to a third preferred embodiment of the present invention.
Figure 12:
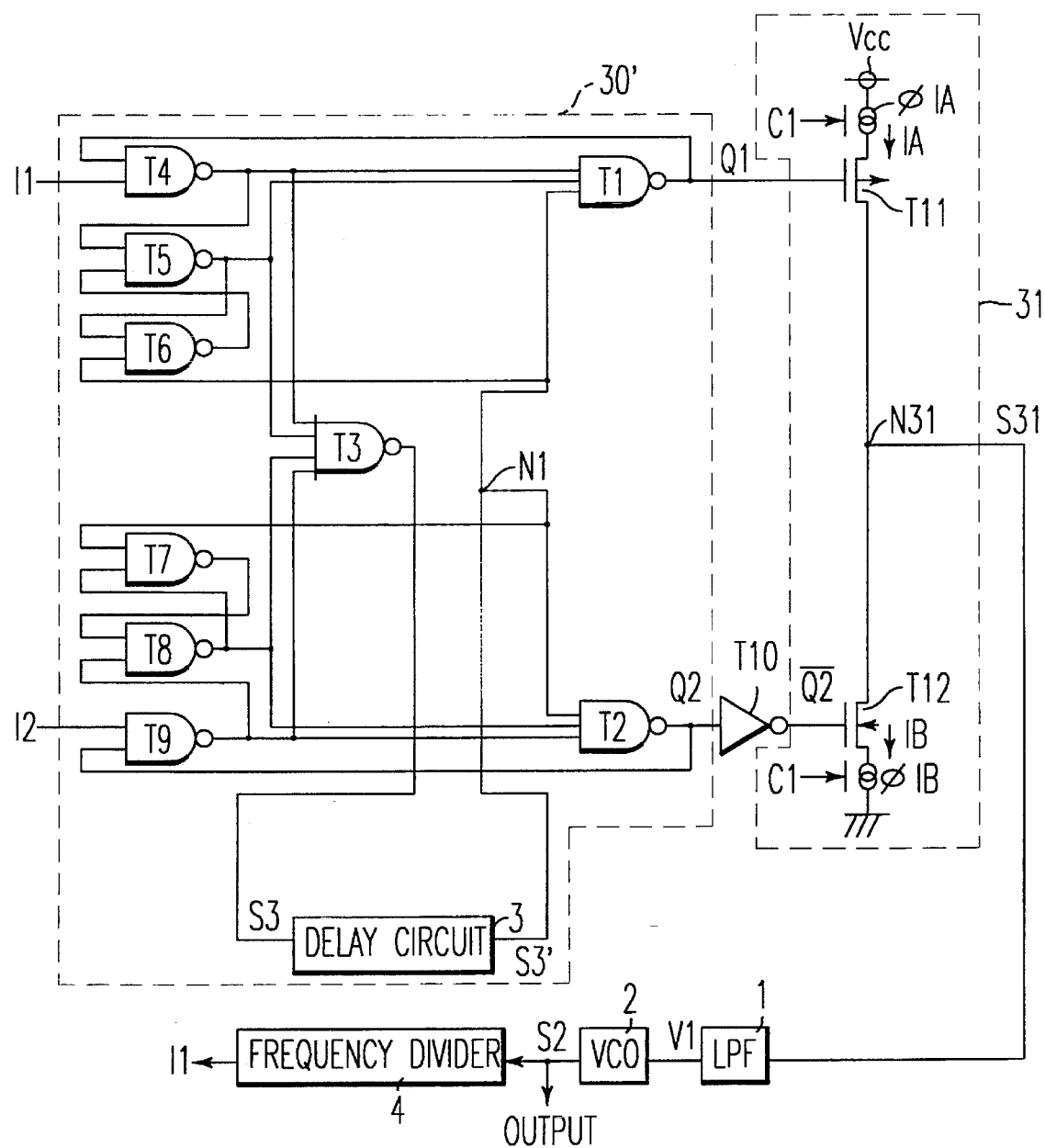
FIG. 12 is a circuit diagram of a conventional PLL circuit.
Figure 13A:
FIG. 13 is a timing chart of the operation of the conventional PLL circuit.
Figure 13B:
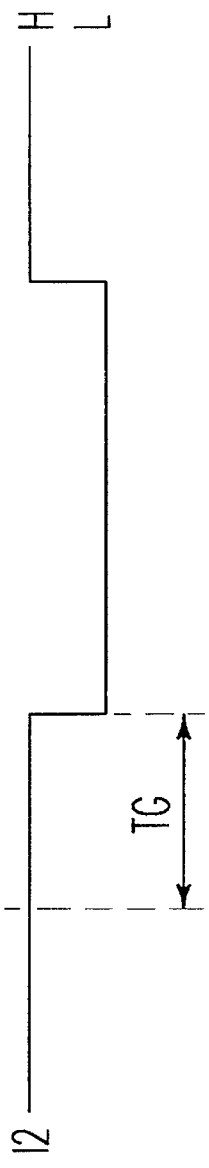
Figure 13C:
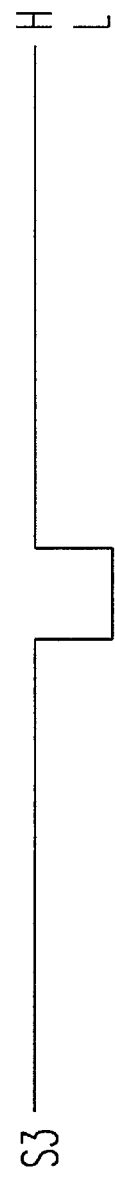
Figure 13D:
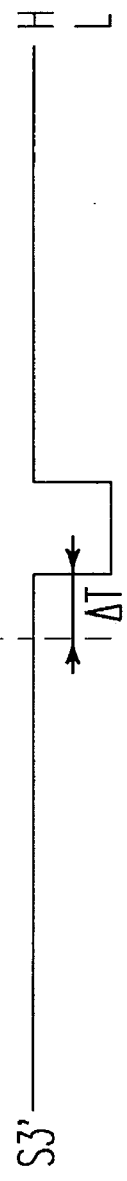
Figure 13E:
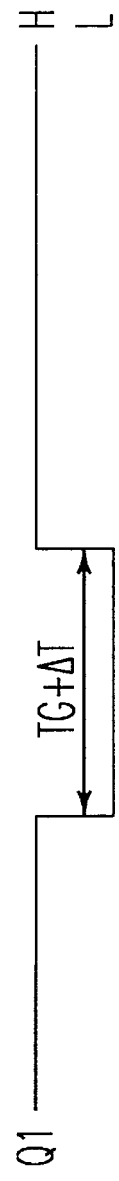
Figure 13F:
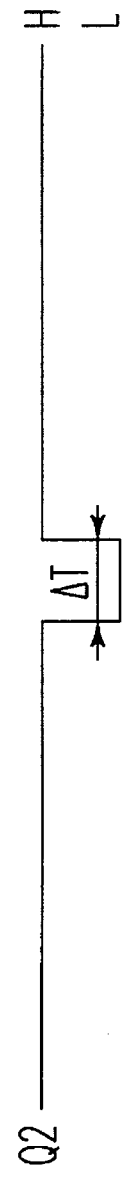

FIG. 11 is a circuit diagram of the PLL circuit according to a third preferred embodiment of the present invention. The PLL circuit of the third preferred embodiment comprises the phase comparator 30", the charge pump circuit 31, a filter bock 12, the VCO 2, and the frequency divider 4, as shown in FIG. 11. Since the PLL circuit of the third preferred embodiment is similar in construction to that of the second preferred embodiment except the filter block 12, description will be given hereinafter only on the filter block 12.

The filter block 12 is comprised of the operational amplifier 8, the switch 9, a capacitor C12, and a resistor R12. The filter block 12 receives the comparison voltage signal S31 from the charge pump circuit 31 and applies a control voltage V12 to the VCO 2.

The operational amplifier 8 receives the reference voltage VR at its positive input. The output of the operational amplifier 8 is applied to the VCO 2 through a node N12, and is fed back to the negative input thereof through the switch 9. The output of the operational amplifier 8 is also fed back to the negative input thereof through the resistor R12 and capacitor C12 connected in series. The switch 9 turns on/off in response to "L"/"H" of the control signal C2.

When the switch 9 is on, an electrical short occurs between the output and negative input of the operational amplifier 8 through the switch 9, and the presence of the resistor R12 and capacitor C12 is invalidated. Thus the operational amplifier 8 forces the control voltage V11 to be set to the reference voltage VR in the same manner as the second preferred embodiment.

It should be noted that the reference voltage VR is set to a voltage level which permits the output signal S2 of the VCO 2 to oscillate in a frequency range in practical use.

The PLL circuit of the third preferred embodiment as above described is substantially similar in operation and effect to the PLL circuit of the second preferred embodiment.

Further, the filter block 12 is enabled to serve as an active filter comprised of the capacitor C12, the resistor R12 and the operational amplifier 8. This allows further reduction in lock-up time of the PLL circuit of the third preferred embodiment than that of the second preferred embodiment by increasing the gain of the loop of the PLL circuit with the use of the active filter.

While the invention has been shown and described in detail, the foregoing description is in all aspects illustrative and not restrictive. It is therefore understood that numerous modifications and variations can be devised without departing from the scope of the invention.

What is claimed is:

1. A phase-locked loop (PLL) circuit comprising:
   phase comparing means having delay means and receiving an input signal and a reference signal for outputting a phase comparison output signal having a pulse width, said pulse width being equal to a phase difference between said input signal and said reference signal plus a delay time of said delay means;

charge pump means receiving said phase comparison output signal and an externally applied current control signal for outputting a phase comparison voltage signal based on said phase comparison output signal in an amount indicated by said current control signal;

filtering means for filtering said phase comparison voltage signal to output a control voltage signal; and voltage-controlled oscillating means receiving said control voltage signal for outputting said input signal, said input signal oscillating at a frequency based on said control voltage signal, said phase comparing means, said charge pump means, said filtering means, and said voltage-controlled oscillating means forming a phase-locked loop (PLL) for performing a PLL operation, said delay means of said phase comparing means receiving said current control signal and being responsive to said current control signal for changing said delay time in negative correlation with the amount of current indicated by said current control signal.

2. The PLL circuit of claim 1, wherein said phase comparison output signal of said phase comparing means includes a first phase output signal and a second phase output signal, and wherein, when the phase of said input signal leads that of said reference signal there is a phase lead and said first phase output signal is a pulse signal of a pulse width equal to the phase lead plus said delay time and said second phase output signal is a pulse signal of a pulse width equal to said delay time and, when the phase of said input signal lags that of said reference signal there is a phase lag and said second phase output signal is a pulse signal of a pulse width equal to the phase lag plus said delay time and said first phase output signal is a pulse signal of a pulse width equal to said delay time.

3. The PLL circuit of claim 9 wherein said charge pump means includes:

a first power and second power supply for setting first and second potentials different from each other;

a first variable current source connected at its one end to said first power supply for supplying a first supply current, the amount of said first supply current varying depending on said current control signal;

a second variable current source connected at its one end to said second power supply for supplying a second supply current, the amount of said second supply current varying depending on said current control signal;

a first transistor of a first conductivity type having a control electrode receiving said first phase output signal and a first electrode connected to said first variable current source; and a second transistor of a second conductivity type having a control electrode receiving said second phase output signal, a first electrode connected to said second variable current source, and a second electrode connected to a second electrode of said first transistor.

4. The PLL circuit of claim 3, wherein said first variable current source includes:

first control current generating means for generating a first control current, the amount of said first control current varying depending on said current control signal; and a first current mirror circuit receiving said first control current for outputting said first supply current in proportion to said first control current, and said second variable current source includes:

second control current generating means for generating a second control current, the amount of said second control current varying depending on said current control signal; and a second current mirror circuit receiving said second control current for outputting said second supply current in proportion to said second control current.

5. The PLL circuit of claim 4, wherein said first control current generating means and said second control current generating means are structurally identical, and said first control current and said second control current are structurally identical.

6. The PLL circuit of claim 4, wherein said first potential is higher than said second potential;

said first conductivity type is a P type; and said second conductivity type is an N type.

7. The PLL circuit of claim 6, wherein said first transistor and said second transistor are MOS transistors.

8. The PLL circuit of claim 3, wherein said delay means includes:

a third variable current source connected at its one end to said first power supply for supplying a third supply current, the amount of said third supply current varying depending on said current control signal; and a delay circuit receiving said third supply current for changing the delay time in negative correlation with said third supply current.

9. The PLL circuit of claim 8, wherein said delay circuit sets said delay time so as to be longer than a time period of a dead zone of said charge pump means by a predetermined short time period.

10. The PLL circuit of claim 9, wherein said third variable current source includes:

control current generating means for generating a control current, the amount of said control current varying depending on said current control signal; and supply current generating means receiving said control current for outputting said third supply current in proportion to said control current.

11. The PLL circuit of claim 8, wherein said voltage-controlled oscillating means includes:

a voltage-controlled oscillator for oscillating at a frequency based on said control voltage signal to output an oscillation signal; and a frequency divider for dividing the frequency of said oscillation signal to output said input signal.

12. The PLL circuit of claim 1, wherein said phase comparing means is inactive for a predetermined time period immediately after start of said PLL operation, and said filtering means includes:

a filter portion for filtering said phase comparison voltage signal to output said control voltage signal; and a voltage setting portion for setting said control voltage signal to a level indicative of oscillation of said voltage-controlled oscillating means at an oscillation frequency in practical operation for said predetermined time period immediately after start of said PLL operation.

13. The PLL circuit of claim 12, wherein said voltage setting portion includes:

reference voltage providing means for providing a reference voltage at a level indicative of oscillation of said voltage-controlled oscillating means at an oscillation frequency in practical operation;

an operational amplifier having a positive input and a negative input, said positive input receiving said reference voltage; and switching means for feeding back an output of said operational amplifier to said negative input thereof and causing the output of said operational amplifier to serve as said control voltage signal only for said predetermined time period immediately after start of said PLL operation.

14. The PLL circuit of claim 12, wherein said filter portion is an active filter including a first operational amplifier, and said voltage setting portion includes:

reference voltage providing means for providing a reference voltage at a level indicative of oscillation of said voltage-controlled oscillating means at an oscillation frequency in practical operation;

a second operational amplifier having a positive input and a negative input, said positive input receiving said reference voltage; and switching means for invalidating operation of said filter portion and feeding back the output of said second operational amplifier to said negative input thereof and causing an output of said second operational amplifier to serve as said control voltage signal only for said predetermined time period immediately after start of said PLL operation.

15. The PLL circuit of claim 14, wherein said first operational amplifier and said second operational amplifier are structurally identical.

* * * * *